United States Patent [19]

Chen et al.

[11] Patent Number: 5,164,340

[45] Date of Patent: Nov. 17, 1992

[54] STRUCTURE AND METHOD FOR CONTACTS IN CMOS DEVICES

[75] Inventors: Fusen Chen, Dallas; Frank R. Bryant, Denton; Girish Dixit, Dallas, all of Tex.

[73] Assignee: SGS-Thomson Microelectronics, Inc, Carrollton, Tex.

[21] Appl. No.: 719,791

[22] Filed: Jun. 24, 1991

[51] Int. Cl.⁵ .................... H01L 21/02; H01L 21/465
[52] U.S. Cl. .................... 437/236; 437/240; 437/245; 148/DIG. 133
[58] Field of Search ............. 148/DIG. 133; 437/245, 437/57, 66, 228, 82, 987, 982, 235, 238, 236, 240, 34

[56] References Cited

U.S. PATENT DOCUMENTS

| | | | |
|---|---|---|---|
| 3,940,288 | 2/1976 | Takago et al. | 437/31 |
| 4,224,089 | 9/1979 | Nishimoto et al. | 148/187 |
| 4,499,653 | 2/1985 | Kub et al. | 29/571 |
| 4,535,528 | 8/1985 | Chen et al. | 437/982 |
| 4,745,089 | 5/1988 | Orban | 437/982 |
| 4,966,870 | 10/1990 | Barber et al. | 437/240 |
| 5,006,484 | 4/1991 | Harada | 437/982 |

FOREIGN PATENT DOCUMENTS 0232508  8/1987  European Pat. Off. ............ 437/240

Primary Examiner—Olik Chaudhuri
Assistant Examiner—Loc Q. Trinh
Attorney, Agent, or Firm—Lisa K. Jorgenson; Richard K. Robinson

[57] ABSTRACT

The method for fabrication of openings in semiconductor devices to improve metal step coverage includes forming an active region over a substrate. A metal oxide layer is then formed over the source/drain region. An insulating layer is formed over the metal oxide layer. A photoresist layer is formed over the insulating layer, and patterned to form an opening, exposing a portion of the insulating. The insulating layer is then etched to expose a portion of the metal oxide layer. The photoresist layer is removed and the insulating layer is reflowed so as to form rounded corners at the opening of the insulating layer. The exposed portion of the metal oxide layer is removed to expose a portion of the active region.

21 Claims, 1 Drawing Sheet

STRUCTURE AND METHOD FOR CONTACTS IN CMOS DEVICES

TECHNICAL FIELD

The present invention relates generally to semiconductor integrated circuit processing, and more specifically to a method of forming a structure for contacts in CMOS devices and the structure formed thereby.

BACKGROUND OF THE INVENTION

Metal step coverage has been of prime importance throughout the history of integrated circuit (IC) manufacture. Step coverage, however, has still been a major problem for IC manufacturers even into the late 1980s. Poor step coverage can be found at the sharp vertical step metal to substrate contacts, metal to metal vias, and metal crossovers. As dimensions shrink, conventional techniques used to improve step coverage fall short of expectations and are limited to stringent design criteria.

One method of improving step coverage has been realized through the use of thermal processing. Openings are cut through thick insulating layers using known dry etching processes. The sharp corners of the openings resulting from the dry etch process are rounded off by thermal processing at high temperatures. With the effect of surface tension, at temperatures close to melting point temperatures, almost all of the known insulating materials through which openings are formed tend to bead up eliminating sharp corners and reducing surface area. This reduction in surface area with no reduction in volume is a more thermodynamically stable arrangement.

The direct application, however, of thermal processing has certain disadvantages. For example, in the case of a metal contact, the contact resistance between metal and substrate is often reduced by the use of a suitable implant in the substrate. Thermal processing tends to nullify the effects of an implant because at melting point temperatures of reflow glass, the implanted species tend to diffuse out of the substrate and into the process ambient before the metal layer is deposited. When such diffusion into the process ambient occurs, a number of special implantation steps, according to the specific type of technology employed, may have to be added after thermal processing to achieve the desired contact resistance between metal and substrate.

Historically, an undoped silicon oxide layer of approximately 1500 Angstroms was grown between the insulating layer and the active areas. However, etching contact openings through insulating materials such as phosphorus silicate glass (PSG) or borophosphorus silicate glass (BPSG) may also etch the silicon dioxide layer exposing the underlying active areas. When the insulating layer is then reflowed, the dopants from the insulating layer tend to migrate to underlying active regions.

It would be desirable to use a metal oxide layer between the insulating layer such as a doped glass layer and the active area such that the metal oxide layer can be selectively etched over the insulating layer. It would be desirable to form the metal oxide layer to a sufficient thickness to prevent dopant diffusion from the insulating layer to the underlying active regions.

SUMMARY OF THE INVENTION

Therefore, according to the present invention, after forming a metal oxide layer over a conductive region, an insulating layer is formed over the metal oxide layer. An opening through the insulating layer is formed exposing a portion of the metal oxide layer. The insulating layer is reflowed so as to form rounded corners at the opening of the insulating layer. The portion of the metal oxide layer exposed in the opening is then removed.

BRIEF DESCRIPTION OF THE DRAWINGS

The novel features believed characteristic of the invention are set forth in the appended claims. The invention itself, however, as well as a preferred mode of use, and advantages thereof, will best be understood by reference to the following detailed description of an illustrative embodiment when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures represent a cross-section of a portion of an integrated circuit during fabrication. The figures are not drawn to scale, but instead are drawn so as to illustrate the important features of the invention.

Figure 1:
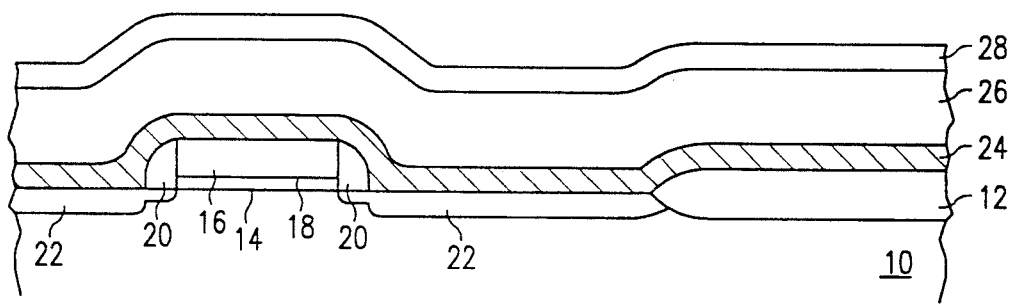
FIGS. 1–4 illustrate a preferred process flow according to the present invention.

Referring to FIG. 1, an integrated circuit is to be formed in a silicon substrate 10. Selected regions of the substrate 10 are oxidized to form a field oxide insulating region 12. A field effect device 14 having a gate electrode 16, a gate oxide layer 18, sidewall oxide spacers 20 and source/drain regions 22 are manufactured by methods known in the art. Gate electrode 16 is generally formed from a first polycrystalline silicon layer, such as commonly used to form gate electrodes or field effect devices.

A metal oxide layer 24 is deposited over a portion of the source/drain region 22. Metal oxide layer 24 is typically a refractory metal oxide layer such as tantalum oxide. Layer 24 may also be an aluminum oxide. The metal oxide layer will be deposited to a depth of approximately 200–1500 Angstroms. Deposition may be by sputtering, CVD or furnace oxidation of a metal film.

An insulating layer 26, preferably BPSG or PSG, is deposited over the entire surface of the chip. In a typical embodiment, the BPSG or PSG layer 26 will be deposited to a depth of approximately 4000 to 8000 Angstroms. A photoresist layer 28 is then spun onto the surface of the wafer. Photoresist layer 28 is patterned to form opening 30, exposing a portion of the insulating layer 26.

Figure 2:
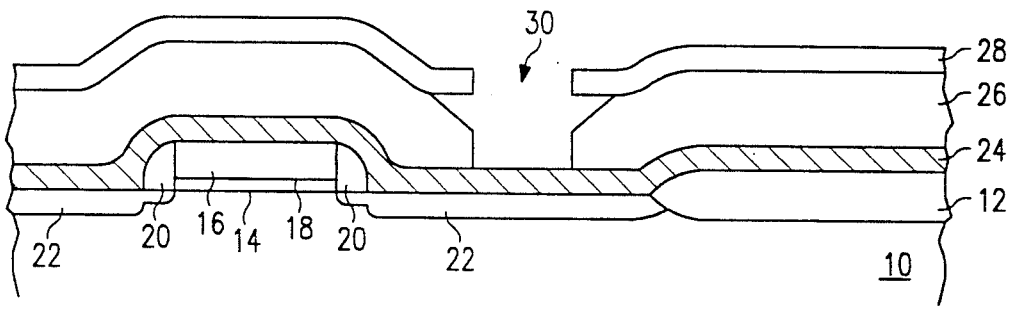

Referring to FIG. 2, insulating layer 26 is then patterned and anisotropically etched to form an opening in opening 30, exposing a portion of the metal oxide layer 24. Alternatively, layer 26 may be isotropically etched partway through the layer before it is anisotropically etched resulting in the angular shape shown in FIG. 2.

Figure 3:
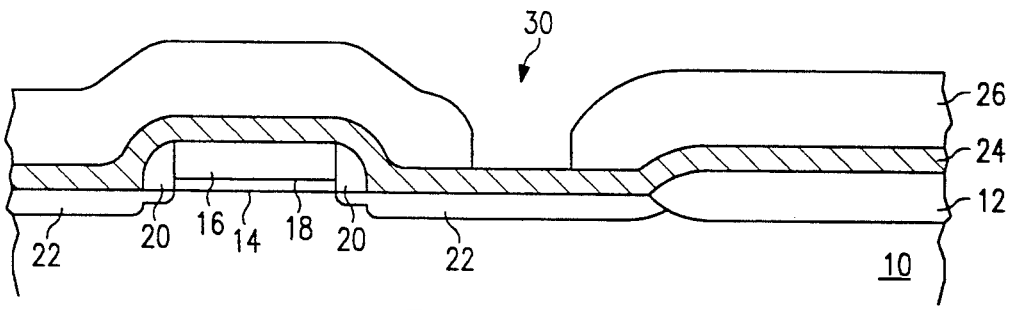

Referring to FIG. 3, the photoresist layer 28 is removed and a thermal heat process is used causing the BPSG or PSG to become soft enough to flow to round out the corners at opening 30. The angle of the corners will tend to be more round if an isotropic etch is used before the anisotropic etch process. Various combinations of wet and dry etching of the BPSG or PSG insulating films will control the angular shape of the corners at the contact openings.

The thermal heat process and temperature may be varied to be made consistent with process flows for the devices being fabricated. The wafer is heated uniformly in a nitrogen ambient by furnace annealing or rapid thermal annealing (RTA). In a typical embodiment, the thermal heating by furnace annealing of the BPSG or PSG layer 26 after deposition will occur at temperatures of approximately 800 to 1100 degrees Celsius for a period of aproximately 20 minutes to 1 hour. The thermal heat process may also be by rapid thermal annealing at approximately 850 to 1150 degrees Celsius for approximately 1 to 5 minutes.

Figure 4:
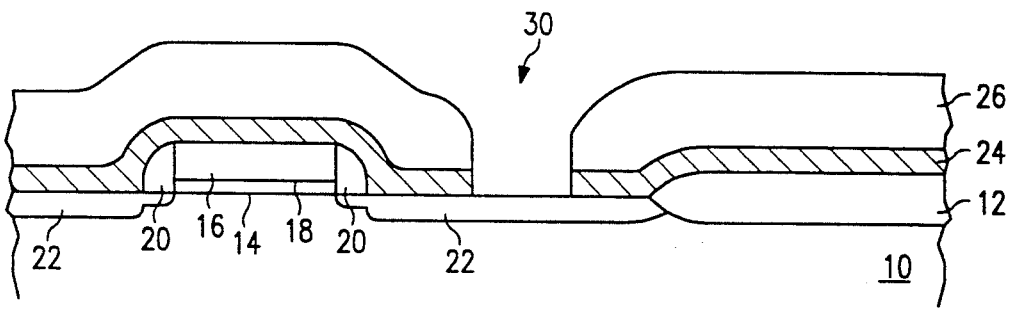

Referring to FIG. 4, the metal oxide layer 24 is selectively etched using known techniques to remove the portion exposed in opening 30. An isotropic etch process is used such that no substantial portion of the insulating layer 26 is removed during the metal oxide etch step. A contact opening may also be made through photoresist layer, insulating layer 26 and metal oxide layer 24 to expose a portion of gate electrode 16 of the field effect device 14 to provide for a metal interconnect to gate electrode 16.

The primary advantage of the present application over the prior art is the high selectivity etch stop of the metal oxide layer during reflow of the insulating layer. Dopant diffusion is prevented through the metal oxide layer from the insulating later during reflow to the underlying active regions such as source/drain regions of a transistor. In addition, the metal oxide layer is selectively etched such that the no substantial portion of the insulating layer is removed. An additional advantage of the metal oxide layer is that outdiffusion or outgassing of the dopant is prevented from the substrate or active area during the furnace reflow process which rounds the corners of a contact opening.

As will be appreciated by those skilled in the art, the process steps described above can be used with nearly any conventional process flow. For example, the metal oxide layer may be used instead of an undoped oxide film between a metal interconnect layer and a gate electrode of a field effect transistor as described above. While the invention has been particularly shown and described with reference to a preferred embodiment, it will be understood by those skilled in the art that various changes in form and detail may be made therein without departing from the spirit and scope of the invention.

What is claimed is:

1. A method of forming an opening in an integrated circuit comprising the steps of:
    forming a metal oxide layer over a conductive region;
    forming an insulating layer over the metal oxide layer;
    forming an opening through the insulating layer exposing a portion of the metal oxide layer;
    reflowing the insulating layer so as to form rounded corners at the opening of the insulating layer; and,
    removing, after reflowing the insulating layer, the portion of the metal oxide layer exposed in the opening.

2. The method of claim 1, wherein the conductive region is an active region of a transistor.

3. The method claim 2, wherein the active region is a source/drain region of the transistor.

4. The method of claim 1, wherein the insulating layer is a glass layer deposited so as to conform to the shape of underlying surfaces.

5. The method of claim 4, wherein the glass layer is PSG or BPSG.

6. The method of claim 1, wherein the forming an opening through the insulating layer step comprises anisotropically etching the insulating exposing a portion of the metal oxide layer.

7. The method of claim 6, further comprising the step of isotropically etching the insulating layer partway through the insulating layer before anisotropically etching the insulating layer.

8. The method of claim 6, wherein the metal oxide layer acts as an etch stop during the etching the insulating layer step.

9. The method of claim 1, wherein the metal oxide layer is a refractory metal oxide.

10. The method of claim 1, wherein the metal oxide layer is an aluminum oxide.

11. The method of claim 1, wherein the metal oxide layer is deposited to a sufficient thickness to prevent dopant diffusion from the insulating layer to the underlying conductive element during the reflowing the insulating layer step.

12. The method of claim 1, wherein the metal oxide layer is selectively etched so as not to remove a substantial portion of the insulating layer.

13. A method of forming an opening in an integrated circuit comprising the steps of:
    forming an active region in a substrate;
    forming a metal oxide layer over the active region;
    forming an insulating layer over the metal oxide layer;
    forming a photoresist layer over the insulating layer;
    forming an opening through the photoresist layer exposing a portion of the insulating layer;
    patterning and etching the exposed portion of the insulating layer to expose a portion of the metal oxide layer;
    removing the photoresist layer;
    reflowing the insulating layer so as to form rounded contact corners at the opening cf the insulating layer; and,
    selectively etching the exposed portion of the metal oxide layer exposing a portion of the active region.

14. The method of claim 13, wherein the active region is a source/drain region of a transistor.

15. The method of claim 13, wherein the etching the exposed portion of the insulating layer step comprises anisotropically etching the insulating exposing a portion of the metal oxide layer.

16. The method of claim 15, further comprising the step of isotropically etching the insulating layer partway through the insulating layer before anisotropically etching the insulating layer.

17. The method of claim 15, wherein the metal oxide layer acts as an etch stop during the etching the insulating layer step.

18. The method of claim 13, wherein the metal oxide layer is a refractory metal oxide.

19. The method of claim 13, wherein the metal oxide layer is an aluminum oxide.

20. The method of claim 13, wherein the metal oxide layer is deposited to a sufficient thickness to prevent dopant diffusion from the insulating layer to the underlying active region during the reflowing the insulating layer step.

21. The method of claim 13, wherein the metal oxide layer is selectively etched so as not to remove a substantial portion of the insulating layer.

* * * * *